United States Patent [19]

Keller et al.

[11] 4,179,312

[45] Dec. 18, 1979

[54] FORMATION OF EPITAXIAL LAYERS DOPED WITH CONDUCTIVITY-DETERMINING IMPURITIES BY ION DEPOSITION

[75] Inventors: John H. Keller, Newburgh; Charles M. McKenna, Fishkill; James R. Winnard, Poughkeepsie, all of N.Y.

[73] Assignee: International Business Machines Corporation, Armonk, N.Y.

[21] Appl. No.: 962,442

[22] Filed: Nov. 20, 1978

Related U.S. Application Data

[62] Division of Ser. No. 858,486, Dec. 8, 1977, Pat. No. 4,151,420.

[51] Int. Cl.$^2$ .................. H01L 21/203; H01L 21/263
[52] U.S. Cl. ..................................... 148/1.5; 148/174; 148/175; 204/192 N; 204/192 S; 427/38; 427/85
[58] Field of Search .................... 148/1.5, 174, 175; 204/192 N, 192 S, 298; 427/38, 39, 42, 85; 250/492 A, 492 B

[56] References Cited

U.S. PATENT DOCUMENTS

| | | |
|---|---|---|
| 3,117,022 | 1/1964 | Bronson et al. ............. 204/192 N X |
| 3,434,894 | 3/1969 | Gale ................... 148/1.5 X |
| 3,520,741 | 7/1970 | Mankarious ........................... 148/175 |
| 3,571,642 | 3/1971 | Westcott ................................. 313/63 |
| 3,909,305 | 9/1975 | Boroffka et al. ........................ 148/1.5 |
| 4,074,139 | 2/1978 | Pankove ........................... 250/492 A |
| 4,086,108 | 4/1978 | Gonda ................................. 148/175 |
| 4,140,546 | 2/1979 | Krimmel ............................... 148/1.5 |

OTHER PUBLICATIONS

Yagi et al., "Germanium and Silicon . . . Ion Beam Deposition", Japanese J. Applied Physics, vol. 16, No. 2, Feb. 1977, pp. 245-251.

Amano et al., "Thin Film Deposition . . . And Design", J. Vac. Sci. Technol., vol. 13, No. 2, Mar./Apr. 1976, pp. 591-595.

Esaki et al., "Incorporation of Dopant . . . Ion Implantation", I.B.M. Tech. Discl. Bull., vol. 17, No. 10, Mar. 1975, pp. 3108-3109.

*Primary Examiner*—L. Dewayne Rutledge
*Assistant Examiner*—W. G. Saba
*Attorney, Agent, or Firm*—George O. Saile

[57] ABSTRACT

A method and apparatus for depositing a monocrystalline epitaxial layer of semiconductor material, e.g., silicon containing selected conductivity-determining impurities, on a semiconductor substrate comprising directing a beam of ions of said semiconductor material at the surface of the semiconductor substrate at an energy level below 0.5 Kev., and simultaneously directing a beam of the conductivity-determining impurity ions at at least a portion of the substrate surface whereby a layer of semiconductor material containing said conductivity-determining impurities is formed on said surface, and heating said layer to a temperature of at least 550° C. to render said layer monocrystalline. The beams of semiconductor ions and of conductivity-determining impurity ions are preferably maintained at a high current density of at least 1 ma/cm$^2$ at the surface of said semiconductor substrate even with a preferable relatively broad beam having diameters of up to 15 cm. Such wide beams are desirably achieved by ion beam apparatus having a high intensity source with a multi-aperture source exit plate.

15 Claims, 10 Drawing Figures

FORMATION OF EPITAXIAL LAYERS DOPED WITH CONDUCTIVITY-DETERMINING IMPURITIES BY ION DEPOSITION

This is a division of application Ser. No. 858,486 filed Dec. 8, 1977, now U.S. Pat. No. 4,151,420.

BACKGROUND OF THE INVENTION

Epitaxial growth of monocrystalline silicon on a monocrystalline silicon substrate is extensively used in the integrated circuit fabrication field. This epitaxial growth is normally carried out by depositing silicon from the vapor phase onto a monocrystalline silicon substrate. In order that this vapor-phase epitaxial silicon growth be successfully carried out, high temperatures in excess of 1000° C. and usually in the order of 1150° C. are conventionally used so that the epitaxially deposited silicon will be monocrystalline in form. If this deposition from the vapor phase is conducted at temperatures below 1000° C., the growth of a uniform monocrystalline epitaxial structure from the vapor phase becomes impractical since polycrystallinity begins to appear in the structure.

While the high temperature epitaxial processes, using temperatures in the order of 1100°-1200° C., have been very effective in producing monocrystalline epitaxial layers, they have been subject to out-diffusion or out-gassing side effects. This phenomenon occurs when the hot silicon vapors come in contact with the silicon substrate at such high temperatures. If the substrate contains regions of varying conductivity-determining atoms such as N+ or P+ pockets, conductivity-determining atoms from these pockets will out-gas or out-diffuse relatively far up into the deposited monocrystalline silicon layer. When the art conventionally used epitaxial layers in the order of from 2 to 6 microns in thickness, this out-diffusion effect usually presented no problem. However, with the art moving in the direction of thinner and thinner epitaxial layers having dimensions below 2 microns and potentially as low as from 5000 Å in future technologies, the problem of out-diffusion in vapor-phase epitaxial growth becomes a substantial one since such out-diffused regions will substantially dominate such thin epitaxial layers.

In addition, with the integrated circuit field moving in the direction of devices with active regions having both lateral and vertical dimensions in the order of 1 micron or less, there is a need in the art for methods of producing devices with active regions having controllable vertical conductivity-determining impurity distributions. Of course, the presently used high heat, i.e., diffusion or epitaxial, methods for the introduction of such impurities tend to restrict control of impurity distribution because of the migration of impurities when subjected to such high temperatures. In addition, even when the impurities are introduced by ion implantation at lower temperatures, the vertical distribution given in an ion implanted region will be less than fully controllable because of dopant penetration phenomena during conventional operations such as annealing and multiple-step implantations.

SUMMARY OF THE PRESENT INVENTION

Accordingly, it is an object of the present invention to provide a method for forming integrated circuits having active regions with controllable vertical impurity distributions.

It is another object of the present invention to provide a method for forming integrated circuits with vertical devices having a plurality of regions below each other with controllable conductivity-determining impurity distributions within such regions.

It is a further object of the present invention to provide a method for forming vertical bipolar integrated circuits with controllable vertical conductivity-determining impurity distribution in the base, emitter and collector regions.

It is even another object of the present invention to provide an ion deposition method for forming monocrystalline semiconductor epitaxial layers with controllable conductivity-determining impurity distribution at temperatures well below 1000° C.

It is an even further object of the present invention to provide apparatus for the ion deposition of epitaxial layers of semiconductor material containing conductivity-determining impurities with controlled distributions.

In accordance with the present invention, a method is provided for depositing a monocrystalline epitaxial layer of a semiconductor material such as silicon containing selected conductivity-determining impurities on a semiconductor substrate such as silicon comprising directing a beam of ions of the semiconductor material at the surface of the semiconductor substrate at an energy level below 0.5 Kev., and simultaneously directing a beam of said conductivity-determining impurity ions at at least a portion of the substrate whereby a layer of semiconductor material containing said conductivity-determining impurities is formed on said surface, after which the layer is heated to a temperature in the order of from 550°-900° C. to anneal the deposited layer into the monocrystalline state. Since, the method is carried out at temperatures well below the 1000° C. temperature at which it is difficult to control the distribution of conductivity-determining impurities, the present method provides epitaxial regions with conductivity-determining impurity distributions which are controllable in the vertical direction. The method is particularly effective when utilizing ion beam apparatus which will provide ion beams maintained at a combined high current density, preferably at least 1 ma/cm$^2$ at the semiconductor surface, particularly in the case of broad beams having diameters of up to 15 cm.

The apparatus for achieving such relatively broad beams with high current density is ion beam apparatus having a high intensity ion source with a multi-apertured source plate through which the ions may be extracted and directed toward the target, i.e., the semiconductor substrate. Such apparatus may be used to provide both the beam of the semiconductor material to be deposited on the semiconductor substrate as well as the beam of the conductivity-determining impurities to be included in the deposited layer.

In accordance with a particular aspect of the present invention, the apparatus further includes a mass separator, i.e., analyzing magnet, adapted to provide coaxial beams of the semiconductor ions and conductivity-determining ions directed at the semiconductor substrate on which the epitaxial layer of semiconductor material is to be formed.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
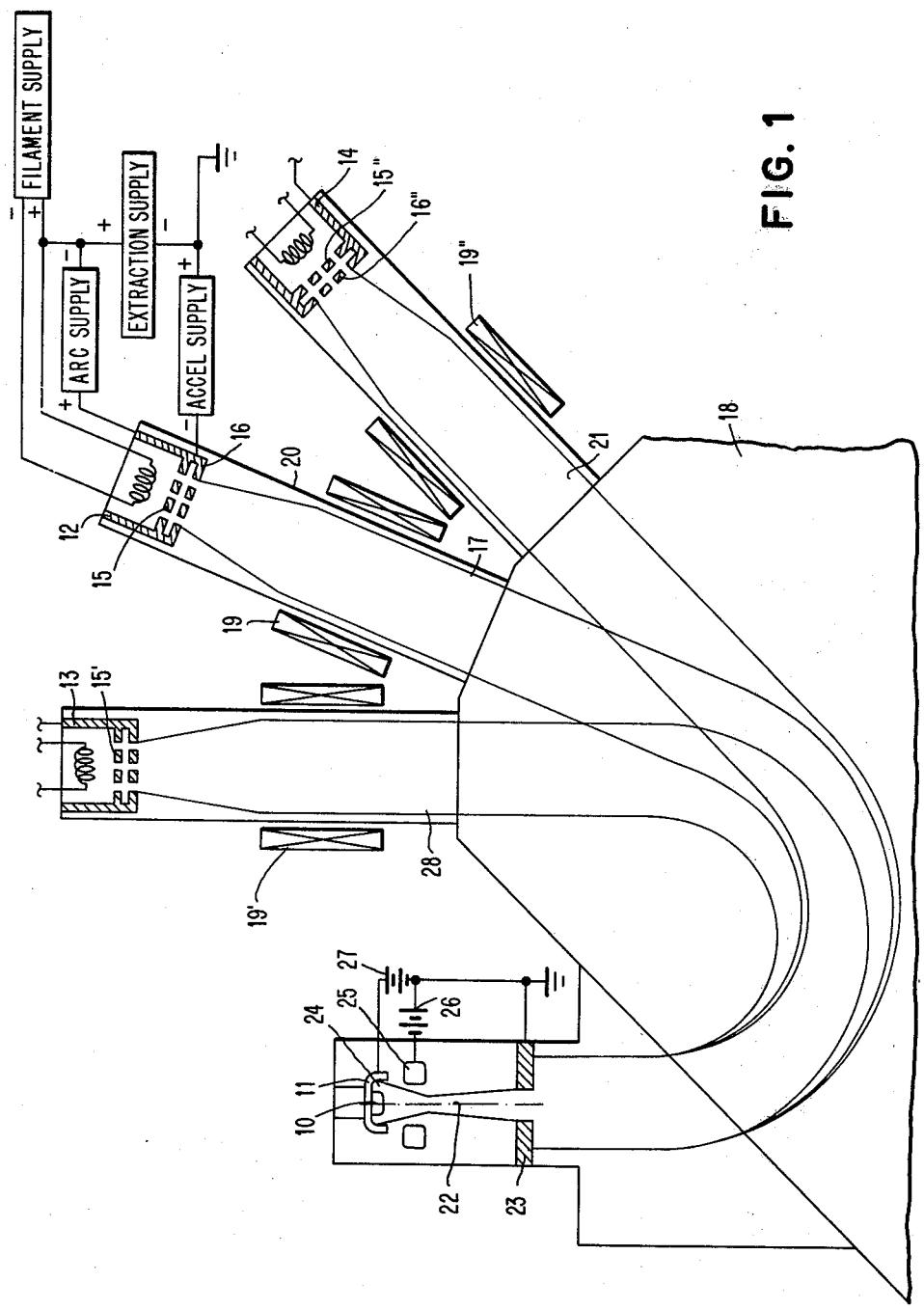
FIG. 1 discloses a schematic representation of ion beam apparatus in accordance with one embodiment of the present invention.
Figure 2:
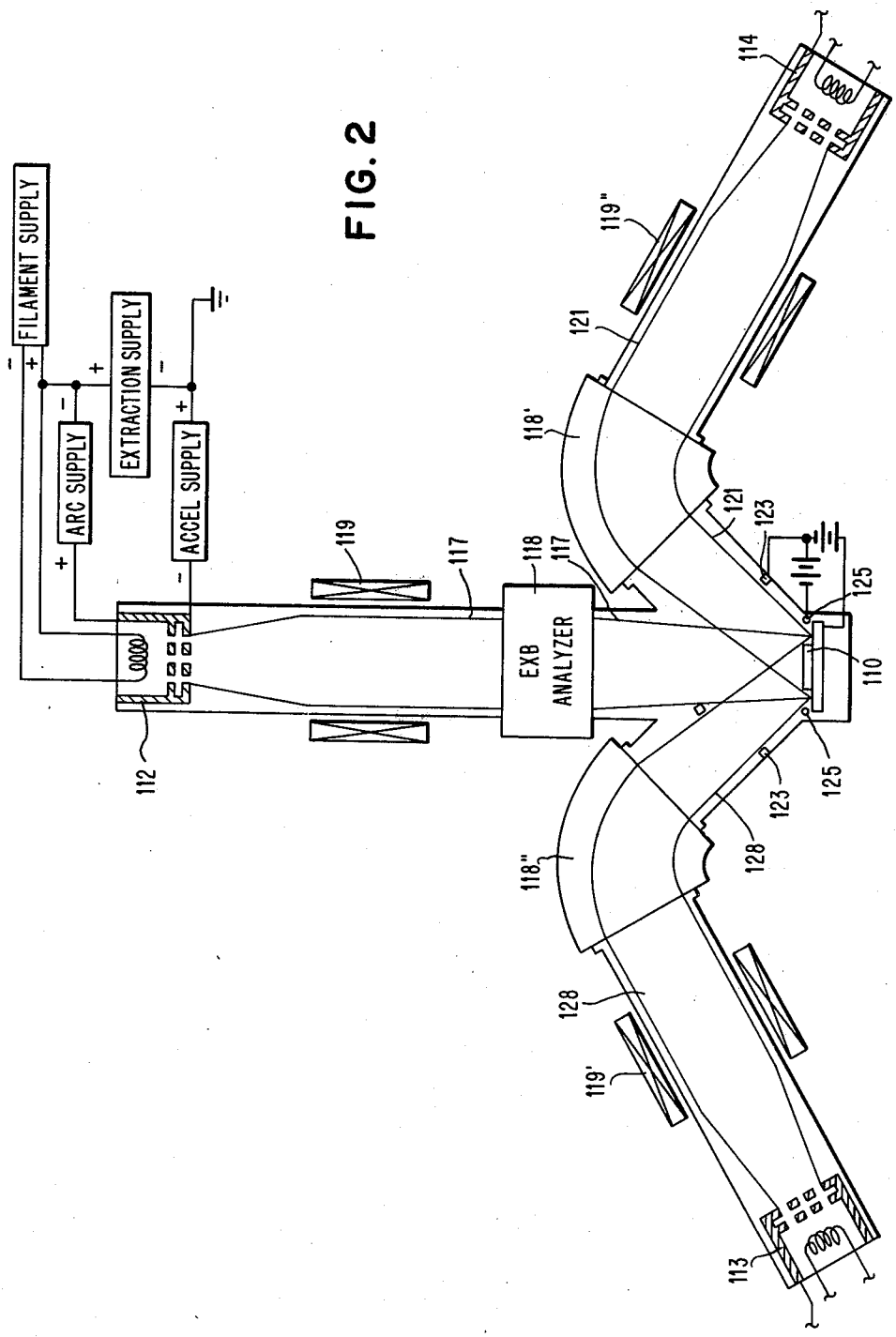
FIG. 2 discloses a schematic representation of ion beam apparatus in accordance with another embodiment of the present invention.

FIGS. 1 and 2 diagrammatically show two embodiments of the apparatus according to the present invention. In the apparatus of FIG. 1, the beam of semiconductor ions and the beam of the conductivity-determining impurity ions are formed respectively from independent sources but directed to a single mass analyzer magnet adapted to provide the beams of said semiconductor ions and said conductivity-determining impurity ions with substantially coaxial trajectories along a selected beam axis at the target substrate. In the apparatus of FIG. 2, the beams of semiconductor ions and conductivity-determining impurity ions not only have separate sources but also have separate mass analyzers, each of the separate mass analyzers being adapted to direct their respective beams onto overlapping areas at the target substrate.

The apparatus of the present invention will first be described with respect to FIG. 1. An epitaxial layer is to be formed on the surface of silicon target wafer 10 which is supported on target holder 11. The apparatus includes a source 12 for the silicon ions as well as a source 13 of N-type impurities such as arsenic and a source 14 of P-type impurities such as boron. For convenience and design of the apparatus, the sources of the conductivity-determining impurities 13 and 14 may have substantially the same structure as the source of the silicon ions 12 which will be described in greater detail. In this detailed description it should be recognized that unless otherwise indicated, the particular ion implantation elements utilized in the combination of the present invention may be of conventional design similar to the apparatus described in U.S. Pat. No. 3,756,862, for example, or in the text, "Ion Beams", R. G. Wilson et al, Wiley-Interscience, 1973. Source 12 in FIG. 1 as well as sources 13 and 14 may be any standard high density source, although in the embodiments shown, a hot filament electron impact source is described operating in a conventional arc-discharge mode. In order to deposit ions over the surface of the wafer 10, it is desirable to utilize beams with relatively broad lateral dimensions at the target, i.e., beams having diameters of up to 15 cm. In order to maintain a high current density of at least 1 ma/cm$^2$ with such relatively broad beams, it is preferable that the source have a multiple apertured exit plate respectively designated 15, 15' and 15" in sources 12, 13 and 14. This multiple apertured exit plate may have a structure such as that described in the article by J. H. Keller et al, pp. 1057–1058, of the IBM Technical Disclosure Bulletin, Sept. 1975, with the exception that the multiple apertured exit plate or source electrode is desirably flat rather than curved. A typical structure for such flat multi-apertured plates in the ion beam technology is shown in U.S. Pat. No. 3,238,715. By way of an illustrative example, a typical multiple apertured plate suitable for the apparatus of the present invention would have a diameter of 10 cm and about 800 apertures, each having a diameter in the order of 2 mm.

The ion beam is extracted from source 12 by multi-apertured extraction electrode 16 which has a plurality of apertures corresponding to and substantially coincident with the apertures in source electrode 15. The extraction electrode 16 which is also known as the accel electrode is maintained at a negative potential by the accel supply, and the source electrode 15 is maintained at a positive potential. The beam of semiconductor ions extracted from ion source 12 is transmitted along a beam path 17 into a mass analyzer magnet 18. In order to maintain the beam 17 of semiconductor ions from spreading to housing walls 20 of the apparatus, a magnetic lens 19 acts to condense, i.e., focus, beam 17 which is spreading upon exiting from the source so that after focusing the beam enters mass analyzer 18 as a substantially parallel beam.

Simultaneously with this operation of semiconductor ion source 12, one of sources 13 and 14 operates to provide a like beam of conductivity-determining impurity ions. For purposes of this illustration, let us assume that source 14 is producing a beam of ions of N-type impurities, e.g., arsenic ions, the beam of arsenic ions 21 is extracted through source electrode 15" by accel electrode 16" and is condensed by magnetic lens 19" and directed into mass analyzer 18. It should be noted that both sources 13 and 14 have power supplies (not shown) equivalent to the power supplies of source 12. Mass analyzer magnet 18 acts to respectively separate the semiconductor ions in beam 17 from other ions in said beam and to separate the arsenic ions in beam 21 from other impurities in the beam and to provide the beams 17 and 21 exiting analyzer 18 with substantially coaxial trajectories along beam axis 22 perpendicular to target wafer 10. In this connection, mass separator apertured plate 23 coacts with mass analyzer 18 to define coaxial beams described above. In addition, analyzer 18 acts to demagnify, i.e., converge the beams so that beams 17 and 21 leaving analyzer 18 are narrower than the beams entering it.

In order for mass analyzer magnet 18 to operate effectively, beams 17 and 21 directed at the magnet by extractors 16 and 16" preferably should have energy levels of from 1 to 10 Kev. However, in order to effectively deposit an epitaxial layer of semiconductor material such as silicon doped with the arsenic impurities on target substrate 10, the combined beam 24 applied to the target should preferably have an energy level below 0.5 Kev. In order to achieve such an energy level at the target wafer 10, a retarding means such as electrostatic deceleration lens 25 acts on the beam before it reaches target wafer 10. Power supplies 26 and 27 maintain deceleration lens gate 25 at a negative potential with respect to beam defining plate 23, thereby directing the beam toward the target but also at a more negative potential with respect to target 10. Thus, target 10 is positive with respect to beam defining plate 23. In this manner, gate 25 and target 10 provide a deceleration lens effect for the beams. With this arrangement, the simultaneous beams directed at the target wafer 10 may be retarded to a potential below 0.5 Kev.

Similarly, if the semiconductor layer to be deposited on substrate 10 is to be doped with a P-type conductivity-determining impurity such as boron, then beam 28 produced from source 13 will be combined with beam 17 of the semiconductor ion in substantially the same manner as beam 21 was combined therewith. This will provide a layer of P-type semiconductor material. Accordingly, by selectively alternating the conductivity-determining impurity which is combined with the beam of semiconductor ions being deposited, an integrated circuit device structure may be formed by alternate layers of P-type and N-type semiconductor material with, of course, the P-N junctions at the interfaces of such layers.

With reference to FIG. 2, an alternate embodiment of the apparatus of the present invention will now be described. Instead of a single mass analyzer used in the apparatus of FIG. 1, the apparatus of FIG. 2 utilizes a discrete mass analyzer for each of the three beams. With this arrangement, while the beams of semiconductor ions and conductivity-determining impurity ions projected upon wafer substate target 10 will not be coaxial, they will overlap so that an epitaxial layer of the semiconductor material containing the selected conductivity-determining impurity may be deposited upon the semiconductor substrate 110. Semiconductor source apparatus 112 as well as conductivity-determining impurity ion sources 113 and 114 are substantially the same in structure as their corresponding sources 12, 13 and 14 in FIG. 1. Likewise, demagnifying magnetic lenses 119, 119' and 119" operate in the same fashion as corresponding demagnifying lenses 19, 19' and 19" in FIG. 1. In FIG. 2, the beam of semiconductor ions 117 and the beams of conductivity-determining impurity ions 121 and 128 are respectively directed to discrete analyzers 118, 118' and 118".

As in the apparatus previously described, it is preferable in the operation of the apparatus of FIG. 2 to form one of the beams of conductivity-determining impurity ions, i.e., either beam 121 of N-type impurity or beam 128 of P-type impurity, and to apply such a beam simultaneously with beam 117 of the semiconductor ions to target semiconductor wafer 110. Discrete mass analyzing magnets 118' and 118" operate in the conventional manner to respectively provide either beam 121 of N-type impurities or beam 128 of P-type impurities. The beam of semiconductor ions 117 is provided through another discrete analyzer, ExB analyzer 118. While the function of analyzer 118 may be conveniently provided by a mass analyzer magnet such as mass analyzer 118', an ExB analyzer may conveniently be used for this function. An ExB analyzer or separator is a mass separator sometimes referred to as a velocity filter; it makes use of an electrical field normal to both the magnetic field and the ion trajectory. Under such conditions a selected class of ions will pass straight through the separator while particles of different mass or velocity will be deflected. This "straight-through" characteristic of the ExB filter is advantageous in the apparatus structure shown in FIG. 2 because the target substrate 110 is substantially along the axis of the source 112. Thus, the ions of the semiconductor material to be separated and deposited upon the target may pass "straight through". ExB analyzers are described in detail on pages 213-227 of the above mentioned R. G. Wilson et text, "Ion Beams". As previously described with respect to the analyzer in FIG. 1, analyzers 118, 118' and 118" act to demagnify, i.e., converge the beams so that beams of semiconductor ions or conductivity-determining impurity ions leaving these analyzers are somewhat narrower than the same beams entering them.

The beams are extracted from their respective sources preferably at energy levels of from 1 to 10 Kev. However, as previously set forth with respect to FIG. 1, in order to effectively deposit an epitaxial layer of semiconductor material such as silicon doped with arsenic impurities on target substrate 110, the overlapping beams, i.e., beams 117 and 121, applied to the target should preferably have energy levels below 0.5 Kev. These energy levels are achieved by retarding means similar to the retarding means described in the apparatus of FIG. 1. Beam defining plate 123 is maintained at a potential level similar to that of plate 23 in FIG. 1, while electrostatic deceleration lens 125 acts in a manner equivalent to that of deceleration lens 25 of FIG. 1 to retard the beam before it reaches target wafer 110.

With reference to FIGS. 3A-3H, the method of the present invention will now be described with respect to the formation of a vertical bipolar transistor portion of an integrated circuit. This process description is primarily for illustrative purposes and it should be understood that the method of the present invention may be used to form integrated circuits containing devices with any combination of deposited epitaxial layers.

Figure 3A:
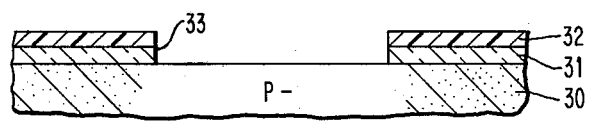
FIGS. 3A–3H are diagrammatic cross-sectional views of a portion of an integrated circuit during various fabrication steps in accordance with the present invention to produce a vertical bipolar transistor.

With reference to FIG. 3A, in a suitable wafer 30 of P-material, i.e., a silicon substrate having a resistivity of 10 ohm/cm, a conventional passivating electrically insulative layer 31 of a material which may be silicon nitride, but for purposes of this illustration is silicon dioxide, is formed. The layer of silicon dioxide may be formed by any conventional technique including thermal oxidation of substrate 30 or chemical vapor deposition. It has a thickness of 10,000 Å. Utilizing a photoresist mask 32 which may be any conventional negative or positive photoresist material having a thickness in the order of 25,000 Å and conventional integrated circuit lithographic fabrication techniques as described, for example, in U.S. Pat. No. 3,539,876, opening 33 is formed in layer 31.

Figure 3B:
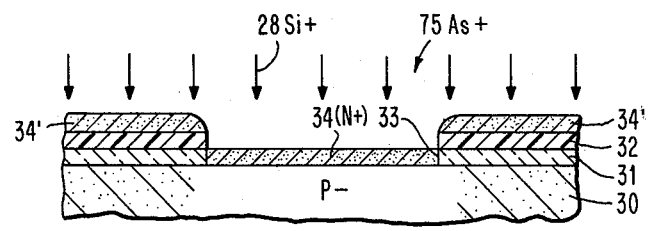

Next, as shown in FIG. 3B, utilizing the apparatus of either FIG. 1 or FIG. 2, the masked substrate is subjected to an ion deposition of silicon, $^{28}Si^+$, and arsenic, $^{75}As^+$, ions; the silicon ion dosage is $5 \times 10^{18}$ ions/cm$^2$. The arsenic dosage may, of course, be varied to provide the desired sub-collector profile; for example, an arsenic ion dosage of $10^{16}$ ions/cm$^2$ may be used to provide an N+ layer of silicon 34 having a peak concentration of $10^{21}$ atoms/cm$^3$ and a thickness of 10,000 Å deposited in opening 33. A portion of this silicon layer 34' is also deposited on the surface of photoresist mask 32.

Next, following conventional "lift-off" techniques, photoresist mask 32 is removed, the "lift-off" carrying with it all portions of N+ layer 34'. In this connection, it should be noted that the "lift-off" techniques are well-known in the art. U.S. Pat. No. 3,873,361 gives a good state of the art picture of such "lift-off" techniques. In accordance with such conventional "lift-off" techniques, layers 32 and 34' may be removed by immersing the structure of FIG. 3B in a conventional photoresist solvent. Conventional photoresist solvents which may be used in such "lift-off" techniques are set forth in U.S. Pat. No. 3,873,361 commencing at column 5, line 45.

Figure 3C:
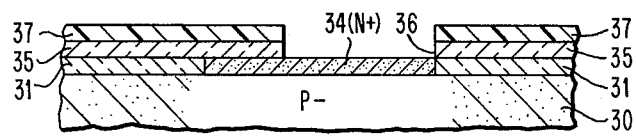

Then, as shown in FIG. 3C, a second layer of silicon dioxide 35 about 2,000 Å in thickness, having opening 36 therein is formed by the conventional photolithographic integrated circuit fabrication techniques described above.

Figure 3D:
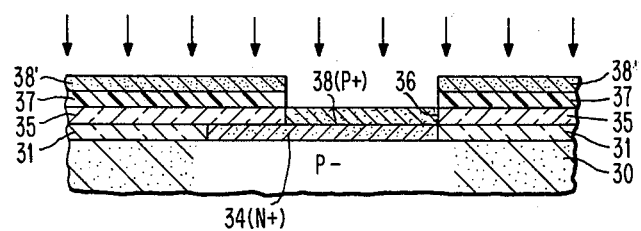
Figure 3E:
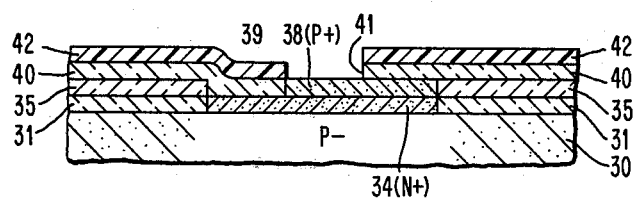

Next, FIG. 3D, with photoresist layer 37 which was used in the photolithographic fabrication of opening 36 still in place, and utilizing either the apparatus set forth in FIG. 1 or FIG. 2, a layer of P+ silicon 38, 2000 Å in thickness and having a P+ concentration of $5\times10^{\sim}$atoms/cm$^3$ is deposited. The ion deposition is conducted with dosages of silicon ions, $^{28}$Si+, of $5\times10^{\sim}$ions/cm$^2$. The boron dosage may be varied to provide the desired base profile; for example, a boron ion, $^{11}$B+, dosage in the order of $10^{14}$ions/cm$^2$. During the deposition of P+ silicon layer 38 in opening 36, a P+ layer 38' will deposit on photoresist layer 37. Then, photoresist layer 37 and P+ silicon layer 38' are removed by the "lift-off" techniques described above. An aperture 39 is etched through layer 35 by conventional lithographic techniques in the region in which the collector contact, i.e., contact to N+ region 34 is to be made subsequently, and then a third layer of silicon dioxide 40 is deposited over the surface of the structure including opening 39. An opening 41 is formed through silicon dioxide layer 40 by photoresist mask 42 utilizing the conventional techniques described above.

Figure 3F:
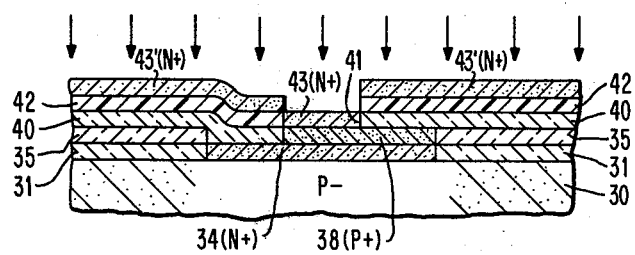

At this point, FIG. 3F, utilizing the apparatus and method described with respect to FIGS. 1 or 2, an N+ layer of silicon 43 is deposited in opening 41. Layer 43 is in the order of 2,000 Å in thickness and has an N+ (arsenic) concentration of $10^{20}$ atoms/cm$^3$. Then, the above described "lift-off" technique is repeated to remove photoresist layer 42 and N+ layer 43' deposited on this photoresist layer.

Figure 3G:
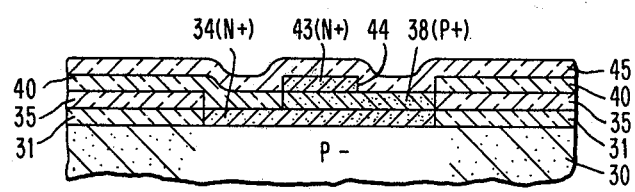

Then, FIG. 3G, an opening 44 is etched through silicon dioxide layer 40 in the region where the base contact is to be subsequently formed after which a fourth layer of silicon dioxide 45 is deposited over the entire structure.

At this point, N+ region 34, which is to subsequently provide the collector, P+ region 38 which is to subsequently provide the base and N+ region 43 which is to subsequently provide the emitter are still non-monocrystalline in structure. Therefore, in order to convert these regions to the crystalline state, the structure of FIG. 3G is subjected to an annealing step conducted at a temperature of from 550° to 900° C. for a period of from 30 to 90 minutes; and specifically at 900° C. for 30 minutes.

Figure 3H:
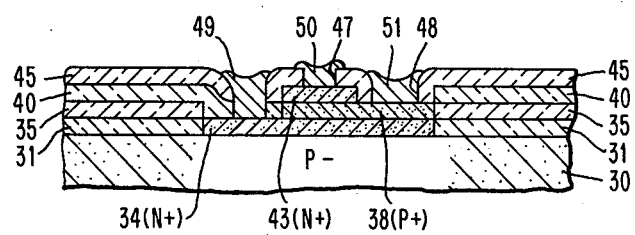

Next, FIG. 3H, utilizing conventional lithographic etching techniques, collector, emitter and base contact openings 46, 47 and 48 are formed through the layers of silicon dioxide, and metal collector contact 49, emitter contact 50 and base contact 51 are respectively formed to N+ collector region 34, N+ emitter region 43 and P+ base region 38. Contacts 49, 50 and 51 which may be formed utilizing the conventional integrated circuit fabrication techniques set forth in U.S. Pat. No. 3,539,876 are normally connected to and form part of a metallization pattern (not shown) formed on silicon dioxide layer 45 which interconnects the devices in the integrated structure.

While the invention has been particularly shown and described with reference to the preferred embodiments thereof, it will be understood by those skilled in the art that various changes in form and details may be made therein without departing from the spirit and scope of the invention.

What is claimed is:

1. A method for depositing a monocrystalline epitaxial layer of a semiconductor material containing selected conductivity-determining impurities on a semiconductor substrate comprising directing a beam of ions of said semiconductor material at the surface of the semiconductor substrate at an energy level below 0.5 Kev., and simultaneously directing a beam of said conductivity-determining impurity ions at at least a portion of said substrate surface whereby a layer of semiconductor material containing said conductivity-determining impurities is formed on said surface, and heating said layer to a temperature of from 550° to 900° C.

2. The method of claim 1 wherein said semiconductor material is silicon and said substrate is silicon.

3. The method of claim 2 wherein said combined beams are maintained at a high current density of at least 1 ma/cm$^2$ at said surface.

4. The method of claim 3 wherein said beam of semiconductor ions has a diameter of up to 15 cm.

5. A method for depositing a monocrystalline layer of a semiconductor material containing selected conductivity-determining impurities on a semiconductor substrate comprising generating a beam containing ions of said semiconductor material, separating said semiconductor material from other ions in the beam and directing said separated semiconductor ion beam at said substrate, generating a beam containing ions of said conductivity-determining impurity, separating said conductivity-determining impurity ions from other ions in said beam and directing said conductivity-determining impurity ion beam at said substrate along an axis coincident with said semiconductor ion beam axis, maintaining the energy level of said coincident beams at said substrate below 0.5 Kev., whereby a layer of semiconductor material containing said conductivity-determining impurities is formed on said surface, and heating said layer to a temperature of from 550° C. to 900° C. to form said monocrystalline layer.

6. The method of claim 5 wherein said semiconductor material is silicon and said substate is silicon.

7. The method of claim 6 wherein said coincident beams are maintained at a high combined current density of at least 1 ma/cm$^2$.

8. The method of claim 7 wherein said beam of semiconductor ions has a diameter of up to 15 cm.

9. The method of claim 4 wherein said layer is initially deposited at ambient temperatures followed by said step of heating the deposited layer.

10. A method for depositing a monocrystalline epitaxial layer of a semiconductor material containing selected conductivity determining impurities on a portion of a semiconductor substrate comprising forming a photoresist mask over the surface of said substrate, said mask having openings defining the epitaxial layer to be deposited, directing a beam of ions of said semiconductor material at said masked surface at an energy level below 0.5 Kev., and simultaneously directing a beam of said conductivity-determining impurity ions at at least a portion of said substrate surface whereby a layer of semiconductor material containing said conductivity-determining impurities is deposited on said mask and exposed surface, removing said photoresist mask to thereby lift-off the layer of semiconductor material deposited on said mask, and heating said remaining layer to a temperature of at least 550° C.

11. The method of claim 10 wherein said semiconductor material is silicon and said substrate is silicon.

12. The method of claim 11 including the further steps of directing a beam of ions of said semiconductor material at the surface of said layer of semiconductor remaining after photoresist removal at an energy level below 0.5 Kev., and simultaneously directing a beam of conductivity-determining impurity ions of a type opposite to that in said layer at at least a portion of said layer surface whereby a second layer of said semiconductor material containing said opposite type conductivity-determining impurities is formed on said first layer surface to thereby form a p-n junction, and also heating said second layer to a temperature of at least 550° C.

13. The method of claim 12 wherein said second layer is formed over a portion of the surface of said first layer by the additional steps of forming, prior to the deposition of said second layer, a photoresist mask over the surface of said first layer, said mask having openings defining the second layer to be deposited, whereby the second layer is deposited on said mask and the exposed surface of said first layer, and removing said photoresist mask to thereby lift-off the portion of the second layer of semiconductor material deposited on said mask.

14. The method of claim 12 wherein said further steps of claim 12 are repeated to thereby form a third layer of said semiconductor material containing conductivity-determining impurities of the type of said first layer on the surface of said second layer and a p-n junction at the interface of said second and third layers.

15. The method of claim 14 wherein said third layer is formed over a portion of the surface of said second layer by the additional steps of forming, prior to the deposition of said third layer, a photoresist mask over the surface of said second layer, said mask having openings defining the third layer to be deposited whereby the third layer is deposited on said mask and the exposed surface of said second layer, and removing said photoresist mask to thereby lift-off the portion of the third layer of semiconductor material deposited on said mask.

* * * * *